Figure 1:
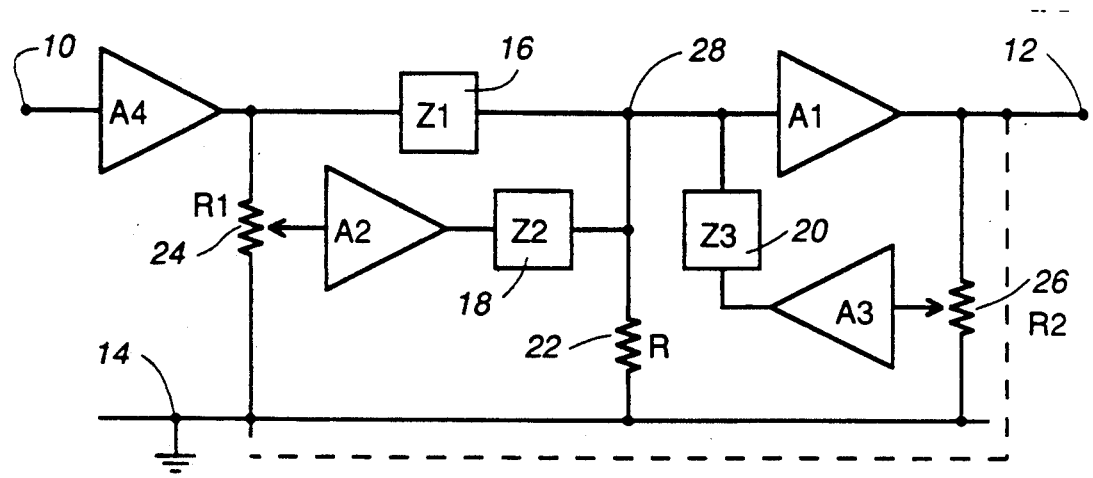

United States Patent [19]

Popescu

[11] Patent Number: 5,006,810

[45] Date of Patent: Apr. 9, 1991

[54] SECOND ORDER ACTIVE FILTERS

[75] Inventor: Petre Popescu, Kirkland, Canada

[73] Assignee: Northern Telecom Limited, Montreal, Canada

[21] Appl. No.: 450,790

[22] Filed: Dec. 14, 1989

[51] Int. Cl.$^5$ .................. H03B 1/00; H03K 5/00; H04B 1/10

[52] U.S. Cl. ............................ 328/167; 307/520

[58] Field of Search ............... 328/167; 307/520, 521; 330/107, 109; 333/173

[56] References Cited

U.S. PATENT DOCUMENTS

| | | | |
|---|---|---|---|
| 3,886,469 | 5/1975 | Rollett et al. | 328/167 |
| 4,195,265 | 3/1980 | Vali | 328/167 |
| 4,594,648 | 6/1986 | Gallios | 328/167 |

Primary Examiner—Timothy P. Callahan
Attorney, Agent, or Firm—R. John Haley; Dallas F. Smith

[57] ABSTRACT

A family of second order active filters is described. A general form of the filter comprises an input terminal, an output terminal, and a common terminal, a first reactance and a resistance coupled in series between the input and common terminals, a first emplifier coupled from a connection point between the first reactance and the resistance to the output terminal, a first potential divider between the input terminal and one of the output and common terminals, a second amplifier coupled from a tapping point of the first potential divider via a second reactance to the connection point, a second potential divider between the output terminal and the common terminal, and a third amplifier coupled from a tapping point of the second potential divider via a third reactance to the connection point, at least one of the reactances being inductive and at least one other being capacitive. Different configurations are described for low-pass, notch, high-pass, band-pass, and all-pass filters, in some of which the first potential divider and second amplifier and second reactance, or the second potential divider and third amplifier and third reactance, are omitted.

20 Claims, 4 Drawing Sheets

SECOND ORDER ACTIVE FILTERS

This invention relates to second order active filters.

It is well known to provide circuits with various filter characteristics for filtering and phase correcting signals. With increasing complexity of electronic circuits, the design requirements for filters are becoming increasingly stringent, and the filters can become increasingly complex, costly, and difficult to adjust or tune to achieve the particular desired filter transfer characteristic.

In addition, it is desirable to facilitate the manufacture of filters at low cost, by using to the largest possible extent components which have standardized values and relatively low tolerances, and by being able to follow a tuning procedure which involves only a single adjustment of each parameter, rather than repeated and recursive adjustments.

An object of this invention, therefore, is to provide a second order active filter which can have various types of filter characteristic and which can be tuned easily to meet particular requirements.

According to one aspect of this invention there is provided a filter comprising: an input terminal, an output terminal, and a common terminal; a first reactance and a resistance coupled in series between the input and common terminals; a first amplifier having an input coupled to a connection point between the first reactance and the resistance and having an output coupled to the output terminal; a potential divider coupled between the output terminal and one of the input and common terminals; a second amplifier having an input coupled to a tapping point of the potential divider and having an output; and a second reactance coupled between the output of the second amplifier and the connection point; wherein one of the reactances is inductive and the other is capacitive.

The invention provides a family of filters with such a configuration, different filter characteristics being provided by different arrangements of the components of the filter.

In a first form of the filter, the potential divider is coupled between the output terminal and the common terminal. With such a form the second reactance can comprise a capacitance. A low-pass filter is then provided if the first reactance comprises an inductance coupled between the input terminal and the connection point, and a band-pass filter is provided if the first reactance comprises an inductance coupled between the connection point and the common terminal. Alternatively, the second reactance can comprise an inductance. A high-pass filter is then provided if the first reactance comprises a capacitance coupled between the input terminal and the connection point, and a band-pass filter is provided if the first reactance comprises a capacitance coupled between the connection point and the common terminal. The filter can be made particularly accurate by including a capacitance coupled in series with the resistance of the potential divider for compensating for a resistance of the inductance which constitutes the second reactance.

In another form of the filter, the potential divider is coupled between the input terminal and the output terminal. With such a form, a band-stop filter is provided if the first reactance comprises an inductance or a capacitance coupled between the input terminal and the connection point.

According to another aspect this invention provides a filter comprising: an input terminal, an output terminal, and a common terminal; a first reactance and a resistance coupled in series between the input and common terminals; a first amplifier having an input coupled to a connection point between the first reactance and the resistance and having an output coupled to the output terminal; a first potential divider coupled between the input terminal and one of the output and common terminals; a second amplifier having an input coupled to a tapping point of the first potential divider and having an output; a second reactance coupled between the output of the second amplifier and the connection point; a second potential divider coupled between the output terminal and the common terminal; a third camplifier having an input coupled to a tapping point of the second potential divider and having an output; and a third reactance coupled between the output of the third amplifier and the connection point; wherein at least one of the reactances is inductive and at least one other is capacitive.

A low-pass notch filter is provided if the first reactance comprises an inductance coupled between the input terminal and the connection point, and the second and third reactances comprise capacitances or if the first reactance comprises a capacitance coupled between the input terminal and the connection point, the second reactance comprises an inductance, and the third reactance comprise a capacitance. A high-pass notch filter is provided if the first reactance comprises a capacitance coupled between the input terminal and the connection point, and the second and third reactances comprise inductances. A high-pass notch filter has a notch or band-stop characteristic with attenuation of lower frequencies below the notch frequency, and conversely a low-pass notch filter has a notch or band-stop characteristic with attenuation of higher frequencies above the notch frequency.

According to a further aspect of this invention there is provided a filter comprising: an input terminal, an output termainal, and a common terminal; a first reactance and a resistance coupled in series between the input and common terminals; a first amplifier having an input coupled to a connection point between the first reactance and the resistance and having an output coupled to the output terminal; and at least one of: (i) a first potential divider coupled between the input terminal and one of the output and common terminals, a second amplifier having an input coupled to a tapping point of the first potential divider and having an output, and a second reactance coupled between the output of the second amplifier and the connection point; and (ii) a second potential divider coupled between the output terminal and the common terminal, a third amplifier having an input coupled to a tapping point of the second potential divider and having an output; and a third reactance coupled between the output of the third amplifier and the connection point; wherein at least one of the reactances is inductive and at least one other is capacitive.

Any of the above filters may include an amplifier via which the potential divider is coupled to the input terminal, the amplifier having an input coupled to the input terminal and an output coupled to the potential divider.

Figure 2:
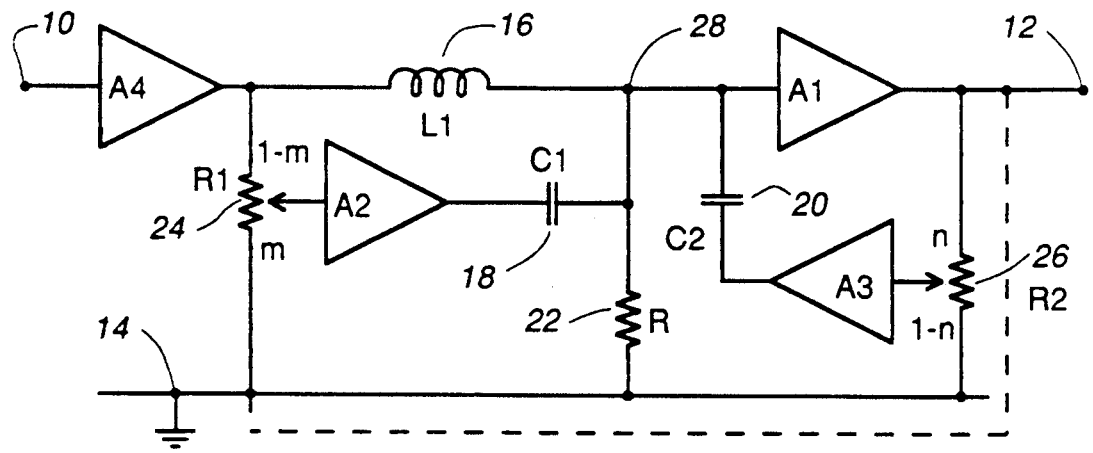
Figure 3:
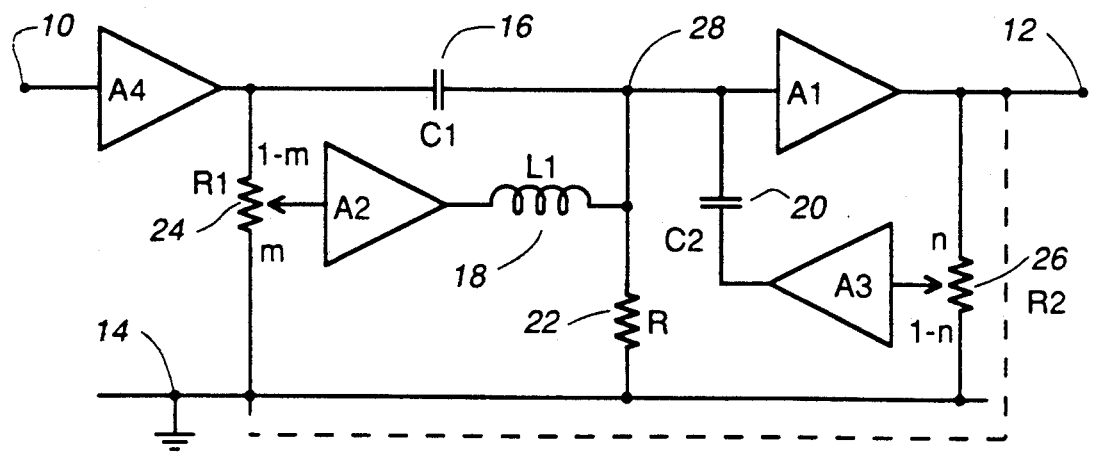
Figure 4:
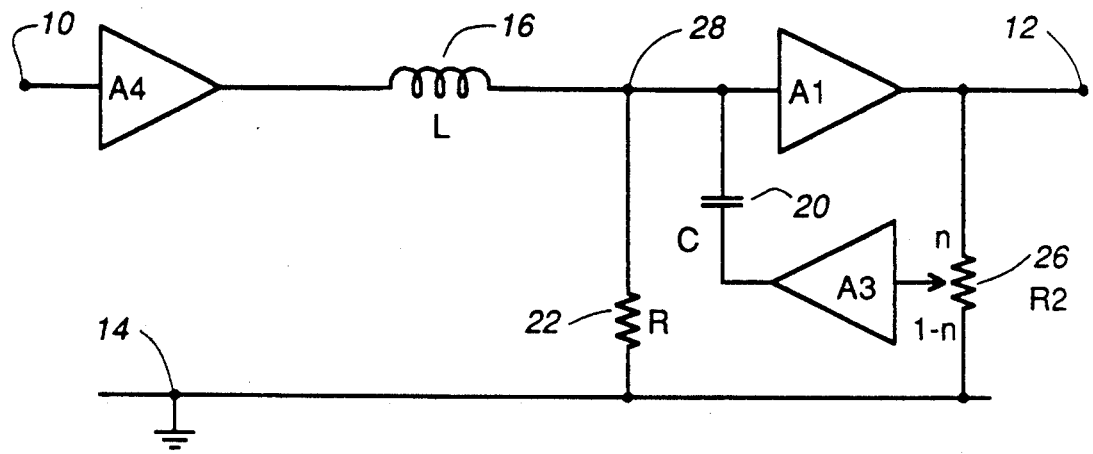
Figure 5:
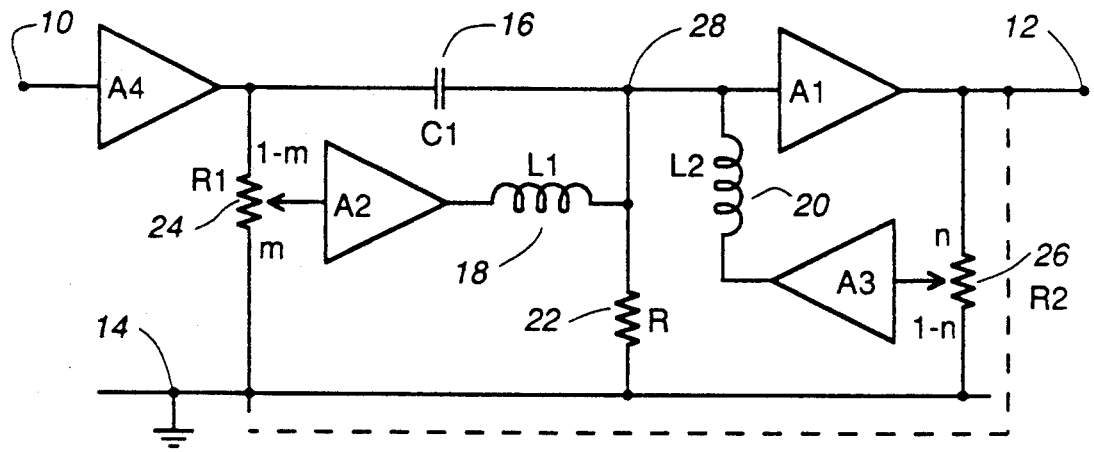
Figure 6:
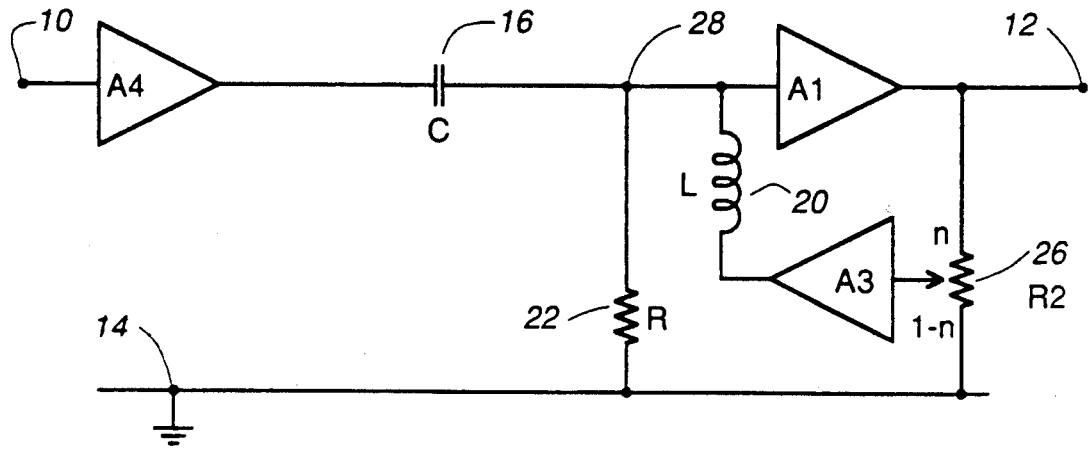
Figure 7:
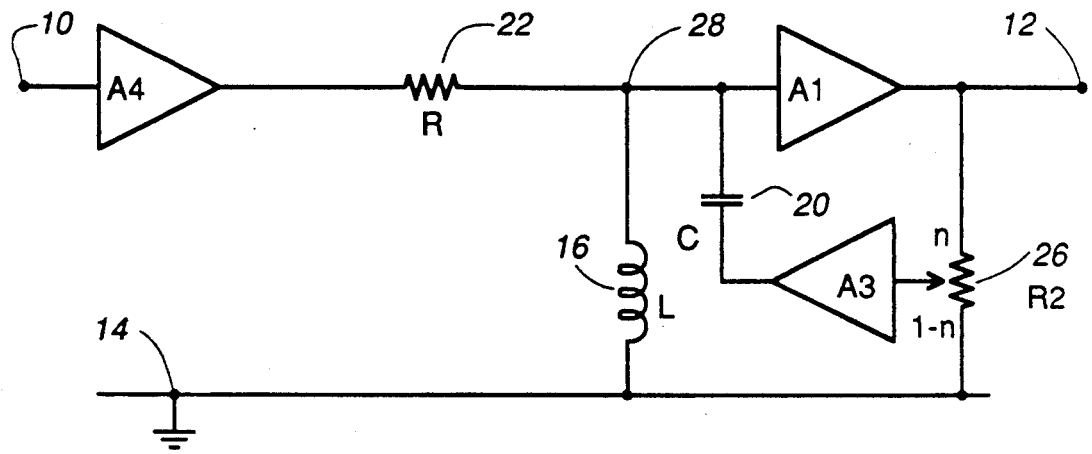
Figure 8:
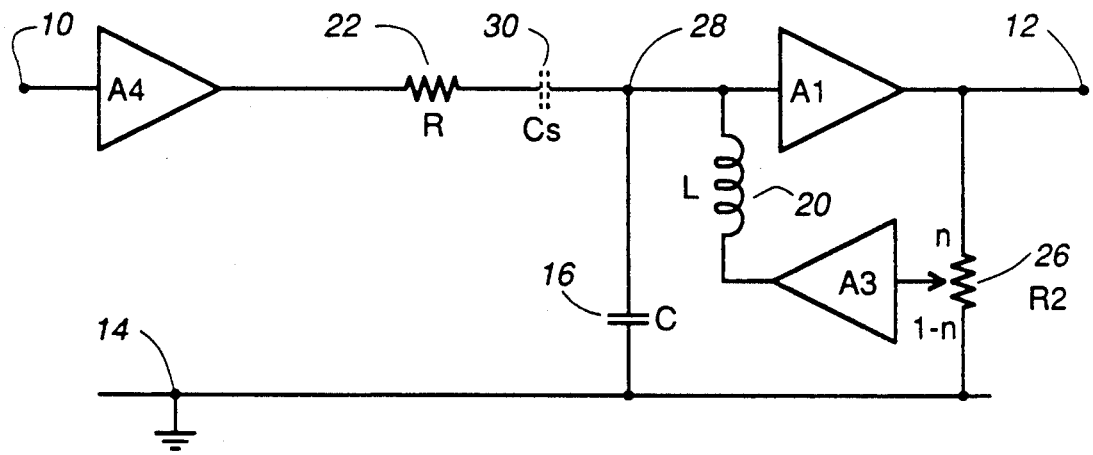
Figure 9:
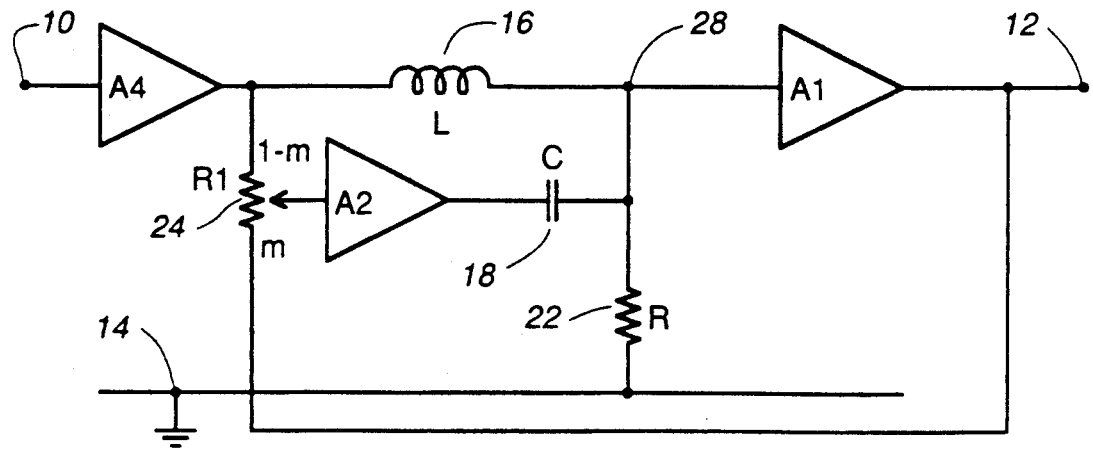
Figure 10:
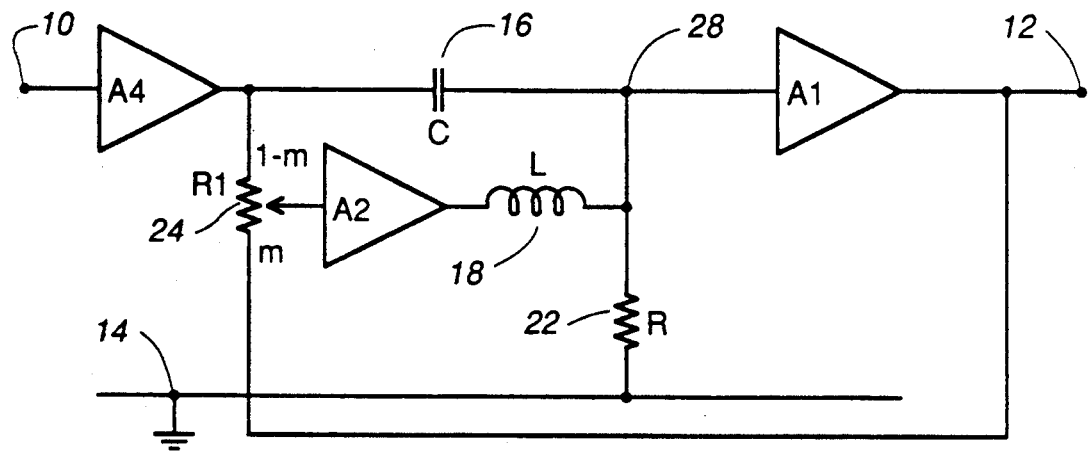
Figure 11:
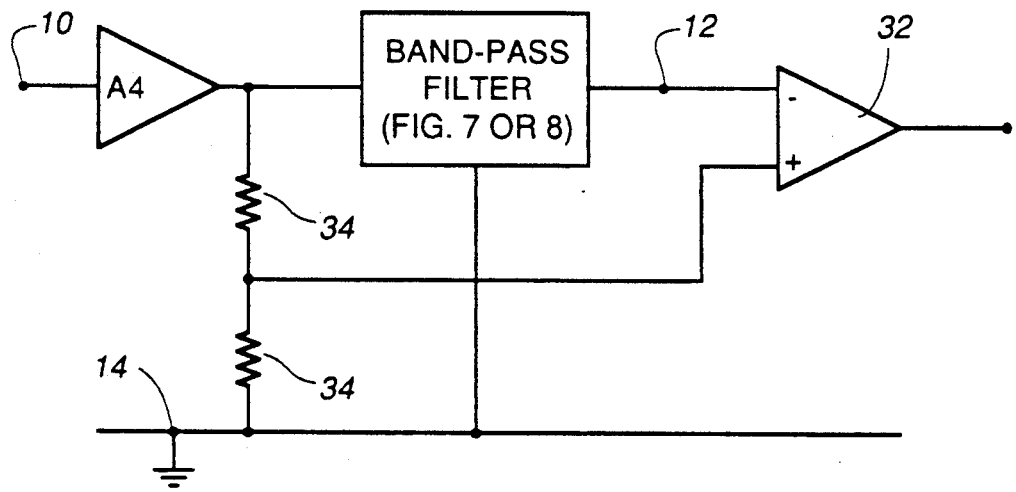
Figure 12:
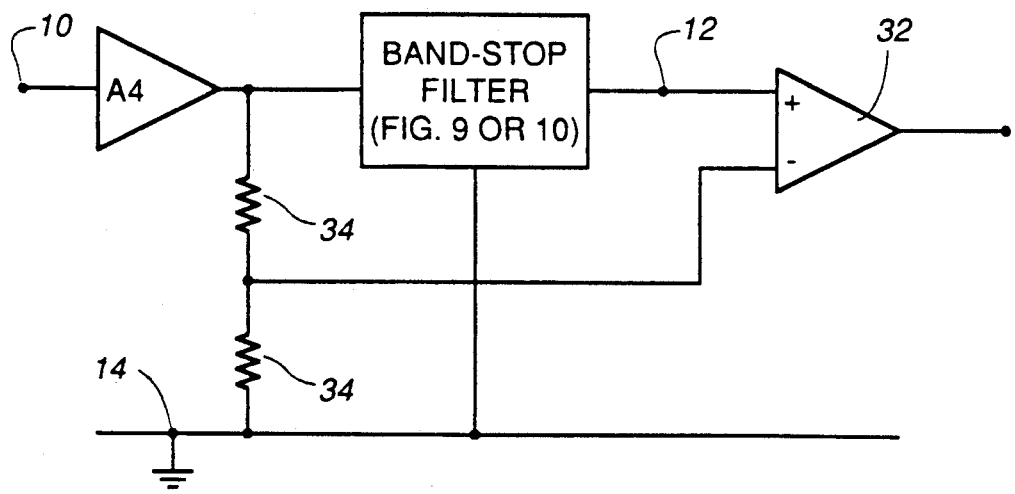

The invention will be further understood from the following description with reference to the accompanying drawings, in which:

FIG. 1 schematically illustrates a general form of filter in accordance with the invention;

FIGS. 2 and 3 schematically illustrate alternative forms of low-pass notch filter in accordance with the invention;

FIG. 4 schematically illustrates a low-pass filter in accordance with the invention;

FIG. 5 schematically illustrates a high-pass notch filter in accordance with the invention;

FIG. 6 schematically illustrates a high-pass filter in accordance with the invention;

FIGS. 7 and 8 schematically illustrate alternative forms of band-pass filter in accordance with the invention;

FIGS. 9 and 10 schematically illustrate alternative forms of band-stop (notch) filter in accordance with the invention; and FIGS. 11 and 12 schematically illustrate alternative forms of all-pass filter in accordance with the invention.

Referring to FIG. 1, there is illustrated therein a general form of filter in accordance with this invention, the filter comprising an input terminal 10 for a signal to be filtered, an output terminal 12 for a filtered signal, a common terminal 14 which is shown as being grounded, amplifiers A1 to A4, reactances 16, 18, and 20 having impedances Z1 to Z3 respectively, a resistor 22 having a resistance R, and resistive potential dividers 24 and 26 having resistances R1 and R2 respectively. The amplifiers A1 to A4 are conveniently unity gain (over the entire bandwidth of the signal to be filtered) buffer amplifiers having a high input impedance and a low output impedance. The amplifier A4 is not an essential part of the filter itself but serves to isolate the remainder of the filter from preceding circuitry which is connected to the input terminal 10; accordingly this amplifier is not discussed further below.

The reactance 16 and the resistor 22 are coupled in series between the input terminal 10 (via the amplifier A4) and the common terminal 14. As shown in FIG. 1, the resistor 22 is closest to the common terminal 14, but as described further below the positions of the reactance 16 and the resistor 22 can be interchanged. The amplifier A1 has an input connected to a connection point 28 between the reactance 16 and the resistor 22 and an output connected to the output terminal 12.

As shown by solid line connections, the potential divider 24 is coupled between the input terminal 10 (via the amplifier A4) and the common terminal 14, and the amplifier A2 has an input connected to a tapping point of this potential divider 24 and an output coupled via the reactance 18 to the connection point 28. Similarly, the potential divider 26 is coupled between the output terminal 12 and the common terminal 14, and the amplifier A3 has an input connected to a tapping point of this potential divider 26 and an output coupled via the reactance 20 to the connection point 28. As described in further detail below, either the components 24, A2, and 18 or the components 26, A3, and 20 may be omitted to form different configurations of the filter. In addition, as shown in FIG. 1 by a broken line, the potential divider 24 can be connected to the output terminal 12 instead of to the common terminal 14, so that it is then couple between the input terminal 10 (via the amplifier A4) and the output terminal 12.

The reactances 16, 18, and 20 can be inductive or capacitive, provided that at least one of them is inductive and at least another of them is capacitive. When the reactance 18 is present, its impednace Z2 is generally of the opposite nature to the impedance Z1 of the reactance 16, i.e. Z2 is inductive if Z1 is capacitive, and Z1 is capacitive if Z1 is inductive.

Although not shown in the drawings, it should be appreciated that the reactance 18 having the impedance Z2 can be constituted partly by a reactive component 18 connected as shown and partly by another reactive component of the same type (i.e. inductive if the reactance 18 is inductive, or capacitive if the reactance 18 is capacitive) which is connected in parallel with the reactance 16. Similarly, the reactance 20 having the impedance Z3 can be constituted partly by a reactive component 20 connected as shown and partly by another reactive component of the same type which is connected in parallel with the resistor 22.

Referring to FIG. 2, a low-pass notch filter is illustrated in which the impedances Z1, Z2, and Z3 of FIG. 1 are constituted by an inductance L1, a capacitance C1, and a capacitance C2 respectively. In FIG. 2, tapping ratios m and n are also shown for the potential dividers 24 and 26 respectively. For example, in the solid line configuration of FIG. 2, the resistance between the common terminal 14 and the input of the amplifier A2 is $mR1$ and the resistance between the output of the amplifier A4 and the input of the amplifier A2 is $(1-m)R1$.

The filter of FIG. 2, which can conveniently be used for an elliptic (Cauer) or an inverted Chebyshev filter, has a transfer characteristic T(s) of the form $T(s)=(s^2+z^2)/(s^2+(sp/Q)+p^2)$, and thus is controlled by the three parameters z, p, and Q. The parameter z is a zero frequency which is determined by the values L1, C1, and m. Thus in designing the filter of FIG. 2 the values L1 and C1 can be chosen as standard values and the value of m adjusted or tuned to provide an exact desired value of the notch frequency. The parameter p is a pole frequency which is determined by the values L1, C1, m in the case of the broken line configuration, and n. Thus having tuned m as described above, the value of n can be adjusted or tuned to provide a desired pole frequency p, without changing the zero frequency z. The parameter Q is the quality factor of the filter, which is determined by the above values and by the reseistance R. Thus after tuning m and n as described above, the value of the resistance R can be adjusted to provide a desired value of Q, without changing the frequencies z and p.

The filter of FIG. 2 can, therefore, be easily tuned to provide a desired characteristic.

The transfer characteristic of the filter of FIG. 2 can be expressed by the equation $T(s)=k(s^2+z^2)/s^2+(sp/Q)+p^2)$, where $z^2=1/(mL1C1)$. For the solid line configuration of FIG. 2, $$p^2 = 1/(L1(C1 + nC2)), Q = R\sqrt{((C1 + nC2)/L1)},$$

and $k=mC1/(C1+nC2)$. For the broken line configuration of FIG. 2, $$p^2 = 1/(L1(mC1 + nC2)), Q = R\sqrt{((mC1 + nC2)/L1)},$$

and $k=mC1/(mC1+nC2)$.

FIG. 3 illustrates an alternative form of low-pass notch filter with a similar transfer characteristic, again controlled by the three paramenters z,p, and Q. In the filter of FIG. 3 the impedances Z1, Z2, and Z3 of FIG. 1 are constituted by a capacitance C1, an inductance L1, and a capacitance C2 respectively, and the tapping ratios m and n are shown as in FIG. 2. As in the case of the filter of FIG. 2, in designing the filter of FIG. 3 the values L1 and C1 can be chosen as standard values and the value of m adjusted or tuned to provide an exact desired value of the notch or zero frequency z, the value of n can the be adjusted or tuned to provide a desired pole frequency p, without changing the zero frequency z, and the value of the resistnace R can then be adjusted to provide a desired value of Q, without changing the frequencies z and p. The filter of FIG. 3 can, therefore, also be easily tuned to provide a desired characteristic.

The transfer characteristic of the filter of FIG. 3 can also be expressed by the equation $T(s) = k(s^2+z^2)/(s^2+(sp/Q)+p^2)$, where in this case $z^2 = m/(L1C1)$ and $k = C1/(C1+nC2)$. For the solid line configuration of FIG. 3, $$p^2 = 1/(L1(C1 + nC2)) \text{ and } Q = R\sqrt{((C1 + nC2)/L1)}.$$

For the broken line configuration of FIG. 3, $$p^2 = m/(L1(C1 + nC2)) \text{ and } Q = R\sqrt{(m(C1 + nC2)/L1)}.$$

FIG. 4 illustrates a low-pass filter, in which the components 24, A2, and 18 of FIG. 1 are omitted and the impedances Z1 and Z3 of FIG. 1 are constituted by an inductance L and a capacitance C respectively. The transfer characteristic of the filter of FIG. 4 can be expressed by the equation $T(s) = p^2/(s^2+(sp/Q)+p^2)$, where $p^2 = 1/(nLC)$ and $$Q = R\sqrt{(nC/L)}.$$

Thus this filter is also easily tuned by firstly selecting standard values of L and C and adjusting n ot provide a desired pole frequency p, and then adjusting the resistance R to provide a desired quality factor Q without changing the value of p.

Referring to FIG. 5, a high-pass notch filter is illustrated in which the impedances Z1, Z2, and Z3 of FIG. 1 are constituted by a capacitance C1, an inductance L1, and an inductance L2 respectively. FIG. 5 also shows the tapping ratios m and n for the potential dividers 24 and 26 respectively. The filter of FIG. 5 has the transfer characteristic $T(s) = (s^2+z^2)/(s^2+(sp/Q)+p^2)$, where as discussed above the three parameters z, p, and Q are respectively the zero frequency, pole frequency, and quanlity factor of the filter. The values L1 and C1 can be chosen as standard values and the value of m adjusted or tuned to provide an exact desired value of the notch or zero frequency z. The value of n can then be adjusted or tuned to provide the desired pole frequency p, without changing the zero frequency z. The value of the resistance R can then be adjusted to provide a desired value of Q, without changing the frequencies z and p. Thus the filter of FIG. 5 can also be easily tuned to provide a desired characteristic. In the above equation for the transfer characteristic of the filter of FIG. 5, $z^2 = m/(L1C1)$, $p^2 = (L2+nL1)/(C1L1L2)$, and $$Q = R\sqrt{(C1(L2 + nL1)/(L1L2))}.$$

FIG. 6 illustrates a high-pass filter, in which the components 24, A2, and 18 of FIG. 1 are omitted and the impedances Z1 and Z3 of FIG. 1 are constituted by a capacitance C and an inductance L respectively. The transfer characteristic of the filter of FIG. 6 can be expressed by the equation $T(s) = s^2/(s^2+(sp/Q)+p^2)$, where $p^2 = n/(LC)$ and $$Q = R\sqrt{(nC/L)}.$$

Thus this filter is also easily tuned by firstly selecting standard values of L and C and adjusting n to provide a desired pole frequency p, and then adjusting the resistance R to provide a desired quality factor Q without changing the value of p.

FIGS. 7 and 8 illustrate alternative forms of band-pass filter, in which the components 24, A2, and 18 of FIG. 1 are omitted, and the positions of the reactance 16 (Z1) and the resistor 22 (R) are interchanged from those shown in FIG. 1. In FIG. 7, the impedances Z1 and Z3 are constituted by an inductance L and a capacitance C respectively, the the center frequency p of the pass band of the filter is given by the equation $p^2 = 1/(nLC)$. In FIG. 8, the impednaces Z1 and Z3 are constituted by a capacitance C and an inductance L respectively, and the center frequency p of the pass band of the filter is given by the equation $p^2 = n/(LC)$. In each case the transfer characteristic of the filter is expressed by the equation $T(s) = (sp/Q)/(s^2+(sp/Q)+p^2)$, and (ignoring the capacitor Cs in FIG. 8 and discussed below) the quality factor is expressed by the equation $$Q = R\sqrt{(nC/L)}.$$

Thus this filter is also easily tuned by firstly selecting standard values of L and C and adjusting n to provide a desired center frequency p, and then adjusting the resistance R to provide a desired quality factor Q without changing the value of p.

FIG. 8 also illustrates a modification of the band-pass filter, in which compensation is provided for the parasitic resistance of the inductance L and the output impedance of the amplifier A3, which are assumed to have a combined resistance r. The compensation is provided in the filter of FIG. 8 by an additional capacitance Cs, shown in dotted lines, which is connected in series with the resistance R and has a value given by the equation $Cs = L/(rR)$. This modification enables a higher degree of accuracy to be achieved and/or a lower quality factor, and hence cheaper, inductance to be used, without changing the tuning procedure. However, in this modified arrangement the quality factor of the filter is expressed by the modified equation $$Q = R\sqrt{(nC/L)/(1 + rRC/L)}.$$

FIGS. 9 and 10 illustrate alternative forms of band-stop or notch filter, in which the components 26, A3, and 20 of FIG. 1 are omitted. In FIG. 9, the impednaces Z1 and Z2 of FIG. 1 are constituted by an inductance L and a capacitance C respectively, and the zero frequency z of the notch (or the center frequency of the stop band of the filter) is given by the equation $z^2 = 1/(mLC)$. In FIG. 10, the impednaces Z1 and Z2 of FIG. 1 are constituted by a capacitance C and an inductance L respectively, and the zero frequency z is given by the equation $z^2 = m/(LC)$. In each case the transfer characteristic of the filter is expressed by the equation $T(s) = (s^2 + z^2)/(s^2 + (sz/Q) + z^2)$, and the quality factor is expressed by the equation $$Q = R\sqrt{(mC/L)}.$$

Thus this filter is also easily tuned by firstly selecting standard values of L and C and adjusting m to provide a desired zero frequency z, and then adjusting the resistance R to provide a desired quality factor Q without changing the value of z.

Although in the above filter arrangements the potential dividers 24 and 26 are described and illustrated as being constituted by variable resistors, it should of course be appreciated that they may alternatively be constituted by fixed resistors having values to provide the desired filter characteristics. In addition, although each of FIGS. 1 to 10 shows the buffer amplifier A4 as being present, as already mentioned this is not an essential part of the filter itself and may be omitted in particular circumstances.

FIGS. 11 and 12 illustrate alternative forms of all-pass filter circuit, which may be used as frequency-dependent phase correction circuits. Each circuit includes a band-pass or band-stop filter as described above, a potential divider comprising two resistors 34 having the same resistance, and a differential amplifier 32 with a gain of 2 over the entire bandwidth of the circuit. Each of FIGS. 11 and 12 shows the buffer amplifier A4 separately from the filter; again this buffer amplifier is optional and need not be present, and of course in these circuit arrangements no buffer amplifier would be present in the filter itself.

In each all-pass filter circuit the above-mentioned potential divider is coupled between the input terminal 10 (via the buffer amplifier A4 if it is present) and the common terminal 14, and has a tapping point connected to one input of the differential amplifier 32. The filter has its output terminal 12 connected to the other input of the differential amplifier 32, whose output constitutes an output of the all-pass filter circuit. In the case of FIG. 11, the filter is a band-pass filter as described above with reference to FIG. 7 or FIG. 8, and its output terminal 12 is connected to the inverting (−) input of the differential amplifier 32, the potential divider tapping point being connected to the non-inverting (+) input of the amplifier 32. In the case of FIG. 12, the filter is a band-stop filter as described above with reference to FIG. 9 or FIG. 10, and its output terminal 12 is connected to the non-inverting (+) input of the differential amplifier 32, the potential divider tapping point being connected to the inverting (−) input of the amplifier 32. In each case the transfer characteristic of the all-pass filter circuit is given by the equation $T(s) = (s^2 - (st/Q) + t^2)/(s^2 + (st/Q) + t^2)$, where t is the center frequency p of the band-pass filter or the zero frequency z of the band-stop or notch filter, and Q is the quality factor of the filter.

Numerous modifications, variations, and adaptations may be made to the particular embodiments of the invention described above without departing from the scope of the invention as defined in the claims.

What is claimed is:

1. A filter comprising:
   an input terminal, an output terminal, and a common terminal;
   a first reactance and a resistance coupled in series between the input and common terminals;
   a first amplifier having an input coupled to a connection point between the first reactance and the resistance and having an output coupled to the output terminal;
   a potential divider coupled between the output terminal and one of the input and common terminals;
   a second amplifier having an input coupled to a tapping point of the potential divider and having an output; and
   a second reactance coupled between the output of the second amplifier and the connection point;
   wherein one of the reactances is inductive and the other is capacitive.

2. A filter as claimed in claim 1 wherein the potential divider is coupled between the output terminal and the common terminal.

3. A filter as claimed in claim 2 whrein the second reactance comprises a capacitance.

4. A filter as claimed in claim 3 wherein the first reactance comprises an inductance coupled between the input terminal and the connection point.

5. A filter as claimed in claim 3 wherein the first reactance comprises an inductance coupled between the connection point and the common terminal.

6. A filter as claimed in claim 2 wherein the second reactance comprises an inductance.

7. A filter as claimed in claim 6 wherein the first reactance comprises a capacitance coupled between the input terminal and the connection point.

8. A filter as claimed in claim 6 wherein the first reactance comprises a capacitance coupled between the connection point and the common terminal.

9. A filter as claimed in claim 8 and including a capacitance coupled in series with the resistance for compensating for a resistance of the inductance which constitutes the second reactance.

10. A filter as claimed in claim 1 and including a capacitance coupled in series with the resistance for compensating for a resistance of the inductive reactance.

11. A filter as claimed in claim 1 wherein the potential divider is coupled between the input terminal and the output terminal.

12. A filter as claimed in claim 11 wherein the first reactance comprises an inductance coupled between the input terminal and the connection point.

13. A filter as claimed in claim 11 wherein the first reactance comprises a capacitance coupled between the input terminal and the connection point.

14. A filter as claimed in claim 1 and including a third amplifier via which the potential divider is coupled to the input terminal, the third amplifier having an input coupled to the input terminal and an output coupled to the potential divider.

15. A filter comprising:
    an input terminal, an output terminal, and a common terminal;
    a first reactance and a resistance coupled in series between the input and common terminals;
    a first amplifier having an input coupled to a connection point between the first reactance and the resistance and having an output coupled to the output terminal;

a first potential divider coupled between the input terminal and one of the output and common terminals;

a second amplifier having an input coupled to a tapping point of the first potential divider and having an output;

a second reactance coupled between the output of the second amplifier and the connection point;

a second potential divider coupled between the output terminal and the common terminal;

a third amplifier having an input coupled to a tapping point of the second potential divider and having an output; and a third reactance coupled between the output of the third amplifier and the connection point;

wherein at least one of the reactances is inductive and at least one other is capacitive.

16. A filter as claimed in claim 15 wherein the first reactance comprises an inductance coupled between the input terminal and the connection point, and the second and third reactances comprise capacitances.

17. A filter as claimed in claim 15 wherein the first reactance comprises a capacitance coupled between the input terminal and the connection point, the second reactance comprises an inductance, and the third reactance comprise a capacitance.

18. A filter as claimed in claim 15 wherein the first reactance comprises a capacitance coupled between the input terminal and the connection point, and the second and third reactances comprise inductances.

19. A filter as claimed in claim 15 and including an fourth amplifier via which the potential divider is coupled to the input terminal, the fourth amplifier having an input coupled to the input terminal and an output coupled to the potential divider.

20. A filter comprising:

an input terminal, an output terminal, and a common terminal;

a first reactance and a resistance coupled in series between the input and common terminals;

a first amplifier having an input coupled to a connection point between the first reactance and the resistance and having an output coupled to the output terminal; and at least one of:

(i) a first potential divider coupled between the input terminal and one of the output and common terminals, a second amplifier having an input coupled to a tapping point of the first potential divider and having an output, and a second reactance coupled between the output of the second amplifier and the connection point; and (ii) a second potential divider coupled between the output terminal and the common terminal, a third amplifier having an input coupled to a tapping point of the second potential divider and having an output; and a third reactance coupled between the output of the third amplifier and the connection point;

wherein at least one of the reactances is inductive and at least one other is capacitive.

* * * * *